US006252456B1

(12) United States Patent
Baker et al.

(10) Patent No.: US 6,252,456 B1
(45) Date of Patent: Jun. 26, 2001

(54) POWER AMPLIFIER LOAD CONTROLLER AND METHOD FOR CONTROLLING A POWER AMPLIFIER LOAD

(75) Inventors: Michael H. Baker, Elmhurst; William J. Turney, Schaumburg, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/364,226

(22) Filed: Jul. 29, 1999

(51) Int. Cl.[7] .............................. H03F 21/00; H03F 1/36; H03G 3/20; H02H 7/20; H01Q 11/12

(52) U.S. Cl. ...................... 330/207 P; 330/107; 330/129; 330/298; 455/117

(58) Field of Search .................................... 330/107, 129, 330/207 P, 298; 455/117, 123, 125, 126

(56) References Cited

U.S. PATENT DOCUMENTS

| | | | | |
|---|---|---|---|---|
| 4,163,981 | | 8/1979 | Wilson | 343/715 |
| 4,380,767 | | 4/1983 | Goldstein et al. | 343/745 |
| 4,493,112 | | 1/1985 | Bruene | 455/123 |
| 4,849,767 | | 7/1989 | Naitou | 343/745 |
| 5,012,235 | | 4/1991 | Audros et al. | 455/54 |
| 5,016,022 | | 5/1991 | Kershaw | 343/750 |
| 5,136,719 | * | 8/1992 | Gaskill et al. | 455/193.1 |
| 5,423,082 | | 6/1995 | Cygan et al. | 455/126 |
| 5,559,468 | | 9/1996 | Gailus et al. | 330/110 |
| 5,564,087 | | 10/1996 | Cygan et al. | 455/126 |
| 5,673,001 | | 9/1997 | Kim et al. | 330/284 |
| 5,675,286 | | 10/1997 | Baker et al. | 330/129 |
| 5,675,287 | | 10/1997 | Baker et al. | 330/129 |
| 5,737,035 | * | 4/1998 | Rotzoll | 455/315 |
| 5,745,844 | * | 4/1998 | Kromer et al. | 330/298 |
| 5,748,038 | | 5/1998 | Boscovic et al. | 330/129 |

* cited by examiner

*Primary Examiner*—Robert Pascal
*Assistant Examiner*—Patricia T. Nguyen
(74) *Attorney, Agent, or Firm*—Jeffrey K. Jacobs

(57) ABSTRACT

The present invention addresses the need for an apparatus and method for controlling the load of a PA, to improve PA efficiency in linear transmitters with isolator elimination (IE) circuitry, that does not require the use of high frequency RF circuitry. The present invention provides a PA load controller (130, 131) that improves the efficiency of a PA (116) by adjusting the PA load using an AGC signal (134), a level set adjustment signal (132), and a signal strength indicator (135), these three signals are readily obtained from continuous gain and phase adjustment circuitry (e.g., 102). The load controller determines a phase of the PA load that minimizes the AGC signal and a phase of the PA load that maximizes the level set adjustment signal. From these determinations, the PA load controller determines a phase of the PA load that improves the efficiency of the PA and adjusts the PA load phase accordingly.

25 Claims, 3 Drawing Sheets

POWER AMPLIFIER LOAD CONTROLLER AND METHOD FOR CONTROLLING A POWER AMPLIFIER LOAD

FIELD OF THE INVENTION

The present invention relates generally to power amplifiers and, in particular, to controlling the load of a power amplifier in a linear transmitter.

BACKGROUND OF THE INVENTION

A variety of linear transmitters implemented using feedback loops around a power amplifier (PA) are in use today. Linear transmitters such as Cartesian feedback transmitters, adaptive predistortion transmitters, and envelope elimination and restoration (EER) transmitters place the PA in a feedback loop in order to reduce, if not cancel, the PA nonlinearities. In such transmitters, the load of an antenna coupled to the PA changes when the antenna is in close proximity to reflective or absorptive objects. It is known in the art to use an isolator between the PA and the antenna to minimize the effect of such load changes on the PA. The weight and size of isolators, however, significantly limit their desirability in today's smaller portable communication devices (e.g., cellular phones). U.S. Pat. No. 5,675,286 discloses the use of isolator elimination (IE) circuitry that continuously tracks and corrects gain, phase, and level set changes in such transmitter feedback loops, thereby eliminating the need for isolators.

IE circuitry optimizes PA efficiency over approximately 30% of the complex PA impedance plane. When the antenna environment moves the impedance (i.e., the PA load) outside the optimized region, the PA has a higher compression point. Better efficiency in these regions could be obtained by simply increasing the PA output power, but product specifications and government regulations (e.g., Federal Communications Commission and European Telecommunications Standardization Institute regulations) limit transmission power. Thus, outside the optimized region, the PA efficiency drops by approximately 10%. In a portable communication device, such a drop in PA efficiency drains the battery more quickly and results in less talk-time per battery charge. Improving the PA efficiency in such instances would have the effect of increasing battery life, and therefore, talk time.

Circuits which move the magnitude and phase of a PA load to a location where the PA has better efficiency are generally know in the art as load pull circuits. Load pull circuits must provide a means for load detection and a means for load correction. The load detection circuits detect the forward and reverse currents and voltages between the PA and the antenna and calculate the load magnitude and phase. The load detection circuits then use these calculations to drive a load adjust circuit. In portable communication devices, such load detection circuits require high frequency RF circuitry that increases the size, weight, and cost of the devices. Improving PA efficiency without incurring the costs associated with RF circuitry is clearly desirable.

Thus, there is a need for an apparatus and method for controlling the load of a PA, to improve PA efficiency in linear transmitters with IE circuitry, that does not require the use of high frequency RF circuitry.

DESCRIPTION OF A PREFERRED EMBODIMENT

Figure 1:
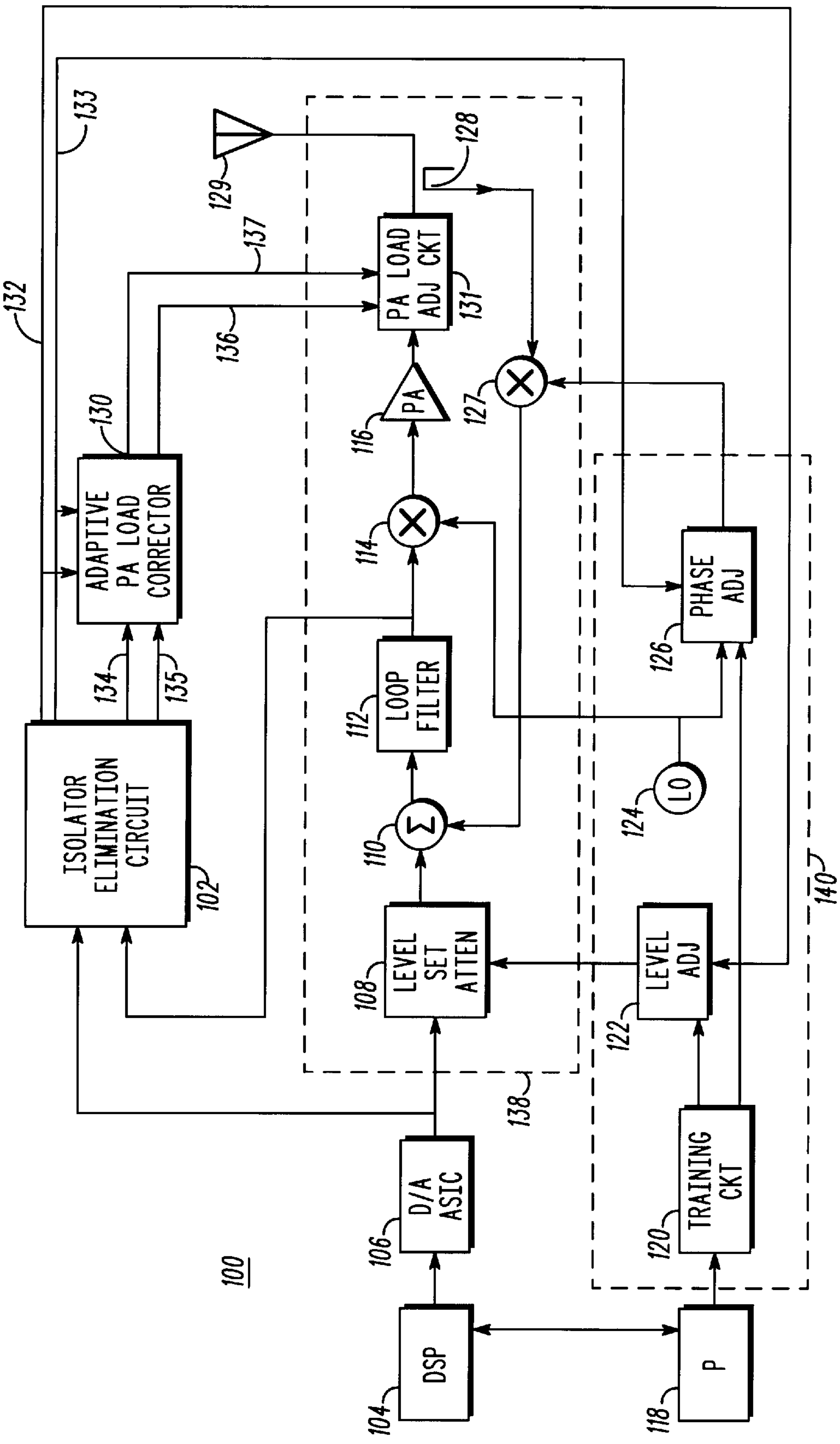
FIG. 1 is a block diagram depiction of a power amplifier load controller within a linear transmitter in accordance with a preferred embodiment of the present invention.

The present invention addresses the need for an apparatus and method for controlling the load of a PA, to improve PA efficiency in linear transmitters with isolator elimination (IE) circuitry, that does not require the use of high frequency RF circuitry. The present invention provides a PA load controller that improves the efficiency of a PA by adjusting the PA load using an automatic gain control (AGC) signal, a level set adjustment signal, and a signal strength indicator. These signals are readily obtained from the continuous gain and phase adjustment circuitry, i.e., the IE circuitry. The load controller determines a phase of the PA load that minimizes the AGC signal and a phase of the PA load that maximizes the level set adjustment signal. From these determinations, the PA load controller determines a phase of the PA load that improves the efficiency of the PA and adjusts the PA load phase accordingly.

The present invention encompasses a PA load controller that comprises an adaptive PA load corrector and a PA load adjust circuit. The adaptive PA load corrector is capable of producing an impedance phase signal using an AGC signal, a level set adjustment signal, and a signal strength indicator. The PA load adjust circuit is capable of adjusting the load of a PA using the impedance phase signal.

Additionally, the present invention encompasses a radio frequency (RF) amplifier apparatus that comprises a main amplifier loop capable of stabilizing an amplifier without using an isolator and an auxiliary loop coupled to the main amplifier loop capable of changing the load of the PA using a sample of a filtered error signal and a sample of the input signal. The main amplifier loop comprises an attenuator for attenuating an input signal, a loop filter coupled to the attenuator for providing a filtered error signal from which a drive signal is derived, a PA for receiving and amplifying the drive signal, and a PA load adjust circuit for adjusting the load of the PA using an impedance phase signal. The auxiliary loop comprises an automatic gain control (AGC) for producing an AGC signal, a magnitude detector for detecting the magnitude of the input signal and producing a signal strength indicator, a first circuit for producing a level set adjustment signal, and an adaptive PA load corrector for producing the impedance phase signal using the AGC signal, the level set adjustment signal, and the signal strength indicator.

The present invention further encompasses a method for a PA load controller to adjust a load of a PA. The PA load controller determines a phase of the load of the PA that minimizes an AGC signal and a phase of the load of the PA that maximizes a level set adjustment signal. The PA load controller further determines a phase of the load of the PA that improves the efficiency of the PA and adjusts the phase of the load of the PA to the phase of the load of the PA that improves the efficiency of the PA as determined.

The present invention also encompasses a method for a PA load controller to adjust a load of a PA. The PA load controller monitors the efficiency of the PA and at least one signal selected from the group consisting of an AGC signal, a level set adjustment signal, and a phase adjustment signal, while varying the phase of the load of the PA. The PA load controller further determines a phase and magnitude of the PA load that improves the efficiency of the PA and adjusts the phase and magnitude of the load of the PA to the phase and magnitude determined.

Figure 2:
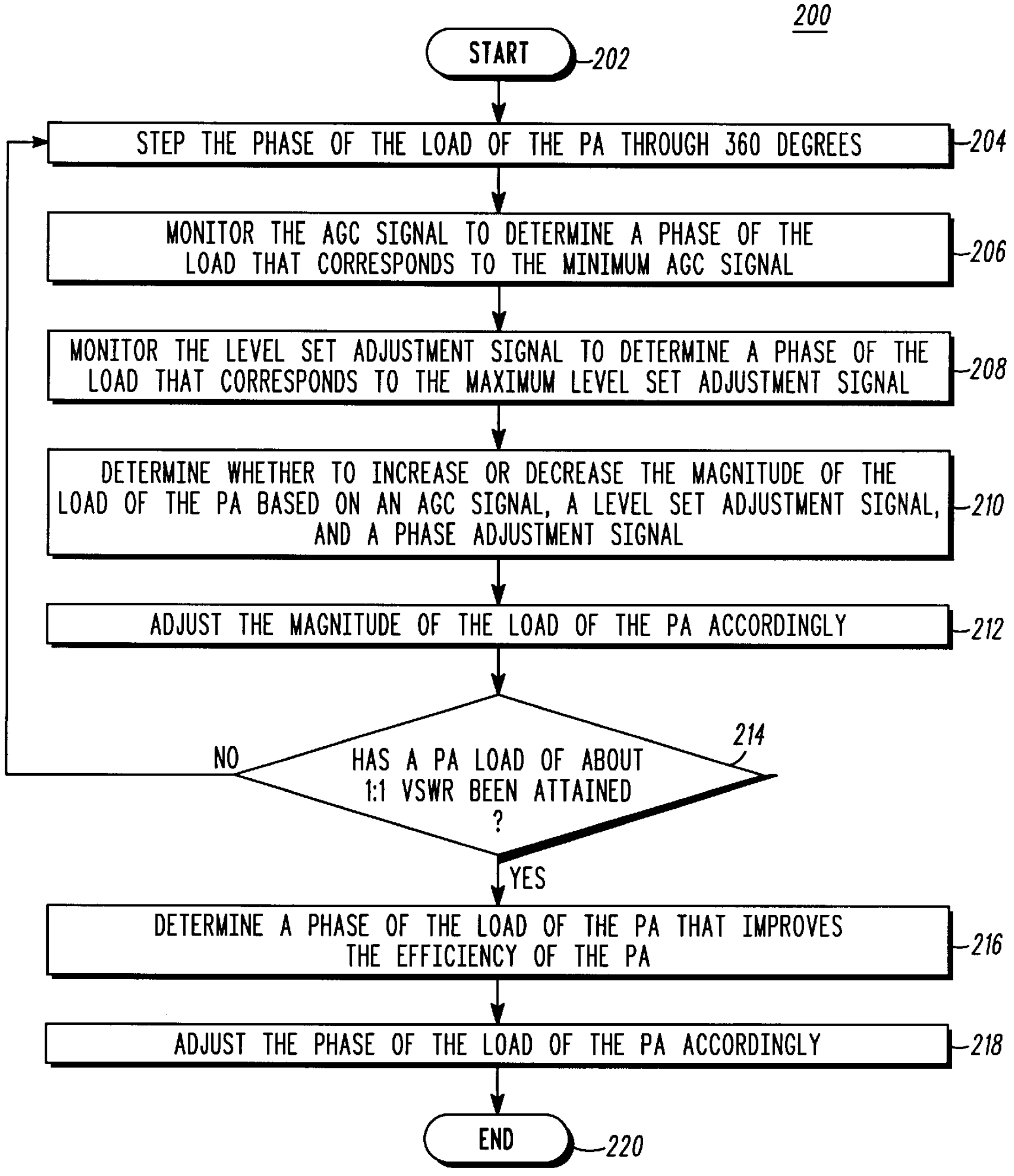
FIG. 2 is a logic flow diagram of steps executed by a power amplifier load controller in accordance with a first preferred embodiment of the present invention.
Figure 3:
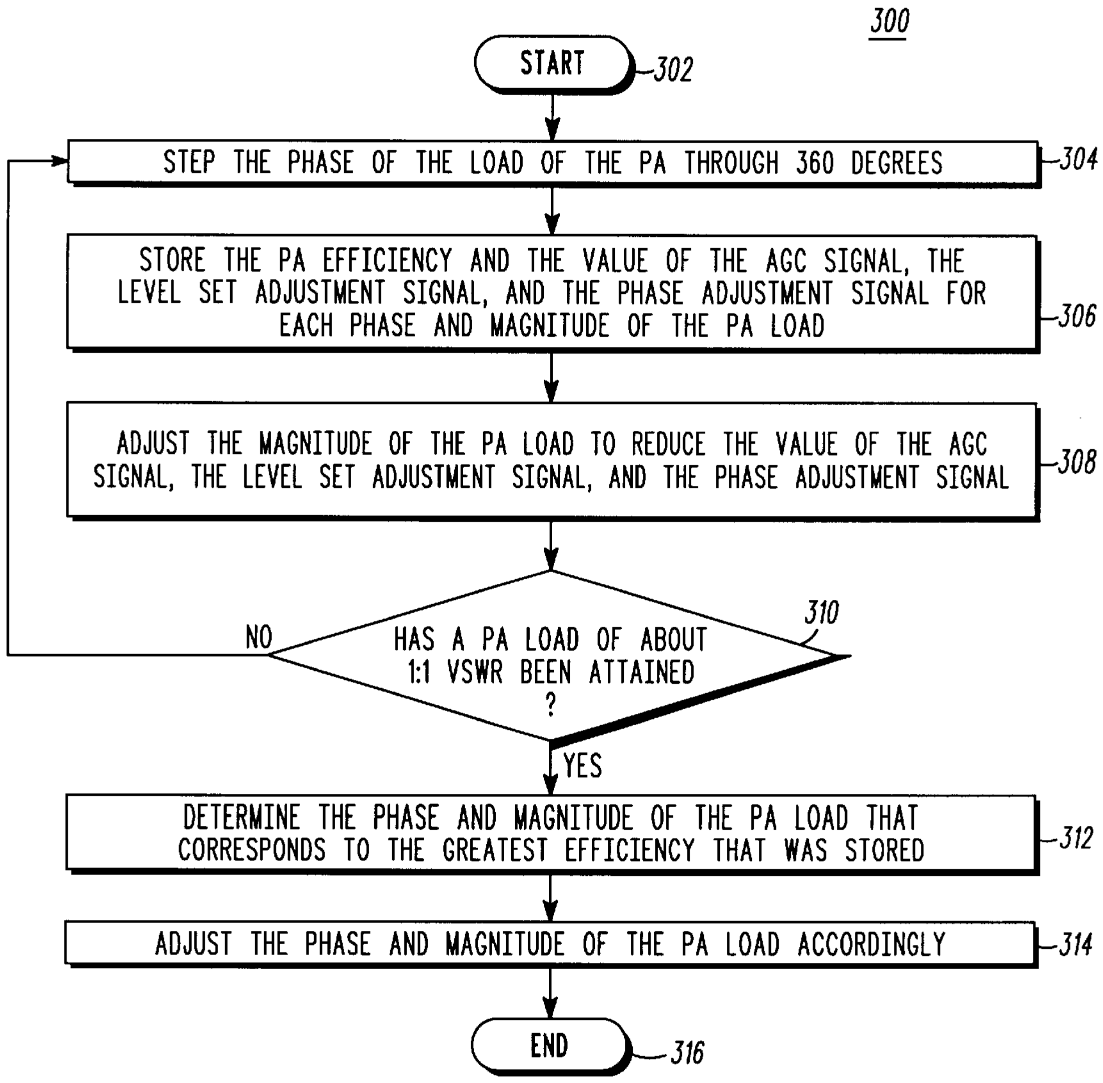
FIG. 3 is a logic flow diagram of steps executed by a power amplifier load controller in accordance with a second preferred embodiment of the present invention.

The present invention can be more fully understood with reference to FIGS. 1–3. FIG. 1 is a block diagram depiction of a PA load controller within a linear transmitter 100 in accordance with a preferred embodiment of the present invention. The PA load controller comprises an adaptive PA load corrector 130 and a PA load adjuster circuit 131. The linear transmitter 100 is preferably comprised of known circuit components which may be integrated individually or along with other components of the linear transmitter 100 to produce one or more integrated circuits suitable for today's cost and space conscious communication devices. Operation of the preferred linear transmitter 100, in accordance with the present invention, occurs substantially as follows.

A digital signal processor (DSP) 104 represents a signal source. The signal sourced by this processor 104 is converted to analog via a digital to analog converter (D/A) 106 to produce an input signal to an RF amplifier feedback loop 138 and an IE circuit 102. The amplifier feedback loop 138 and the isolator elimination circuit 102 establish the main amplifier loop and the auxiliary loop of the present RF amplifier, respectively. The amplifier feedback loop 138 is a closed loop amplifier structure and preferably a Cartesian feedback loop amplifier capable of linearizing the PA. The input signal is a complex digital baseband signal having quadrature components, i.e. in-phase (I) and quadrature (Q) components.

The input signal is received by a level set attenuator 108 in the feedback loop 138. The attenuator 108 provides a modulated reference signal to a summing junction 110. The summer 110 combines this reference signal with a signal fed back from the output of the loop 138 to provide an error signal as input to a loop filter 112. The filtered error signal is up-converted at a mixer 114 to radio frequency to produce a drive signal. This drive signal is then applied to a PA 116 for amplification. The amplified signal is then transmitted via an antenna 129, and a sample of the amplified signal is fed back to the summer 110 via a coupler 128 and a down-converter at mixer 127. The load of the PA 116 is that produced by the antenna 129 and the PA load adjust circuit 131. This PA load varies due to the varying transmission environment of the antenna 129 and the impedance adjustments made by the PA load adjust circuit 131.

In the preferred embodiment, initial level set adjustment for the attenuator 108 and phase shift adjustment for mixer 127 are provided by the training loop 140. The training loop 140 adjusts the gain and phase of the Cartesian feedback loop 138 to keep the loop 138 stable and at an optimum output level for a given frequency, temperature and battery voltage. The optimum output level is set by adjusting the level set attenuator 108 to put the peaks of the modulation at 1 dB compression. The training loop 140 preferably comprises a training circuit 120 coupled to a level adjust circuit 122 and a phase adjust circuit 126. Preferably, the training loop 140 further comprises a local oscillator 124 that provides a signal to the mixer 114 and the phase adjust 126. The training circuit 120 is in communication with the DSP 104 via a microprocessor 118. The training circuit 120 works in conjunction with signals generated by the DSP 104 to accomplish level set adjustments via the level adjust circuit 122 and phase adjustments via the phase adjust circuit 126.

After the transmitter 100 powers up, the training circuitry 140 injects external signals into the main loop 138 and does an initialization train. The initialization train sets the feedback loop phase to avoid unstable operation. The initialization train also adjusts level set attenuator 108 to a value that avoids overdriving PA 116. Both of these actions also avoid adjacent channel interference.

Upon the completion of the initialization train, the isolator elimination circuit 102 through the auxiliary loop takes over the job of adjusting loop phase and level setting during transmission by the linear amplifier 100. The filtered error signal from loop filter 112 and the input signal from the D/A 106 are coupled to the IE circuit 102. The outputs of the IE circuit 102, a level set adjustment signal 132 and a phase adjustment signal 133, are fed back to circuits in the training block 140 to form an auxiliary loop capable of controlling the operation of the feedback loop 138. The gain, phase, and compression point of the feedback loop 138 are adjusted to compensate for the effects of temperature, frequency, battery voltage, and PA load. A more detailed description of the operation of the preferred training loop 140 and preferred IE circuit 102 can be found in U.S. Pat. No. 5,675,286, issued to Baker et al. on Oct. 7, 1997, entitled "Method and Apparatus for an Improved Linear Transmitter", and assigned to Motorola, Inc.

The outputs of the preferred IE circuit 102 comprise the level set adjustment signal 132, the phase adjustment signal 133, an AGC signal 134, and a signal strength indicator 135. The isolator elimination circuit 102 produces these outputs using a sample of the filtered error signal from loop filter 112 and a sample of the input signal from the D/A 106. The preferable IE circuit 102, comprises an AGC for producing the AGC signal 134, a magnitude detector for detecting the magnitude of the input signal and producing the signal strength indicator 135, a first circuit for producing the level set adjustment signal 132, and a second circuit for producing the phase adjustment signal 133. The preferred IE circuit 102 uses very small level set and phase step sizes (e.g., 0.07 dB and 1.4 deg, respectively) and controls the rate at which these step changes are allowed. Also, IE circuit 102 preferably applies its adaptive weights, i.e. produces the phase adjustment signal 133 and the level set adjustment signal 132, when the transmitter input signal is small relative to modulation peaks, e.g. between 9 dB and 15 dB below the input signal modulation peaks. Using small gain and phase step sizes, controlling the rate of step changes, and applying the adaptive weights when the input signal is small all work to reduce adjacent channel splatter.

The preferred adaptive PA load corrector 130 is capable of producing an impedance phase signal 136 and an impedance magnitude signal 137 using the AGC signal 134, the phase adjustment signal 133, the level set adjustment signal 132, and the signal strength indicator 135. In a second preferred embodiment, the PA load corrector 130 further uses the PA voltage and PA current to produce the impedance signal 136 and the impedance magnitude signal 137. The PA current is preferably derived by measuring the voltage across a resistor between the PA and a power source. Because the load corrector 130 uses the above signals, it does not require, and preferably excludes, RF circuit components. The load corrector 130 preferably comprises a DSP with D/A converters for converting the output signals 136 and 137 to analog. Instead of a DSP, however, a load corrector 130 could be implemented using digital circuitry or a microprocessor. In fact, such a load corrector could even be implemented entirely with analog circuitry.

In both preferred embodiments, the impedance phase signal 136 uses a voltage to represent a phase, linearly mapping phase values to corresponding voltages. Similarly, the impedance magnitude signal 137 preferably uses a voltage to represent a magnitude. Alternatively, currents rather than voltages could be used to represent both output signals 136 and 137.

Also, an alternative load corrector, in accordance with the present invention, may only produce an impedance phase signal. Such an alternative load corrector would only use an AGC signal, a level set adjustment signal, and a signal strength indicator to produce the impedance phase signal. This alternative load corrector might be used to reduce manufacturing costs, for example.

Similar to the preferred IE circuit 102, the preferred load corrector 130 changes the impedance phase signal 136 and the impedance magnitude signal 137 only when the signal strength indicator 135 indicates that the input signal is small relative to modulation peaks of the input signal. Also, the rate at which the preferred load corrector 130 changes the impedance phase signal 136 and the impedance magnitude signal 137 is less than the rate at which the IE circuit 102 changes the phase adjustment signal 133 and the level set adjustment signal 132. Specifically, a rate at least ten times less than in IE circuit 102 is preferable, to ensure that increased adjacent channel splatter does not occur.

Coupled to the load corrector 130 is the PA load adjust circuit 131. The PA load adjust circuit 131 is also preferably coupled between the PA 116 and the antenna 129, although alternatively such a PA load adjust circuit could be part of the matching circuit of the antenna or PA. The preferred PA load adjust circuit 131 is capable of adjusting the load (i.e., the impedance phase and impedance magnitude) of the PA 116 using the impedance phase signal 136 and the impedance magnitude signal 137 from the load corrector 130. The load adjust circuit 131 preferably comprises only reactive elements, for example, an inductor and three varactor diodes. The varactors are in a pi network with the inductor in series with the bridge varactor. Such varactor-inductor networks are well known and understood by those in the art, as such networks have been used in antenna tuners for years. Alternatively, a PA load adjust circuit, in accordance with the present invention, may only adjust the impedance phase of the PA load using an impedance phase signal. Such an alternative PA load adjust circuit might be used, in addition to the alternative load corrector, to reduce costs.

Maximum power transfer to the antenna 129 occurs when the load of the PA 116 is near the characteristic impedance of the system. A load equal to the characteristic impedance corresponds to a voltage standing wave ratio (VSWR) of 1:1, and larger VSWRs correspond to impedances that are further from the characteristic impedance. In the preferred embodiment, the best case efficiency occurs for loads near 1:1 VSWR. Thus, the present invention attempts to drive the PA load towards a target load magnitude of 1:1 VSWR. As the PA load approaches the characteristic impedance and the phase of the PA load impedance is swept through 360 degrees, all three of the IE adaptive weights (i.e., the AGC signal 134, the phase adjustment signal 133, and the level set adjustment signal 132) will show less and less change, approaching zero. Thus, by monitoring the amount of change in the adaptive weights as the impedance phase of the PA 116 is swept through 360 degrees, the impedance magnitude of the PA 116 is moved towards a 1:1 VSWR.

The method by which the PA load controller adjusts the load of the PA can be more fully understood with reference to FIG. 2 and FIG. 3. FIG. 2 is a logic flow diagram 200 of steps executed by the PA load controller in accordance with a first preferred embodiment of the present invention. While FIG. 3 is a logic flow diagram 300 of steps executed by the PA load controller in accordance with a second preferred embodiment of the present invention. In the second preferred embodiment, PA voltage and PA current are used to directly determine the efficiency of the PA. In contrast, the first preferred embodiment improves PA efficiency without directly determining PA efficiency. Thus, two preferable embodiments are provided, one that requires the direct measurement of PA efficiency and one that does not.

The logic flow of logic flow diagram 200 begins (202) when the preferred load controller steps (204) the phase of the PA load through 360 degrees. The load controller does this to determine a magnitude of the PA load that improves the efficiency of the PA, a phase of the PA load that minimizes the AGC signal, and a phase of the PA load that maximizes the level set adjustment signal. The load controller monitors (206) the AGC signal, to determine a phase of the load that corresponds to the minimum of the AGC signal, and monitors (208) the level set adjustment signal, to determine a phase of the load that corresponds to the maximum of the level set adjustment signal. The load controller monitors these signals while stepping the phase of the PA load through 360 degrees. For each 360 degree cycle, the load controller preferably incorporates the phase that corresponds to the maximum of the level set adjustment signal for that cycle and the phase that corresponds to the minimum of the AGC signal for that cycle into a moving average of the phase values. These moving average phase values represent the phase at which the level set adjustment signal is at maximum and the AGC signal is at minimum over all the 360-degree cycles.

The load controller then determines (210) whether to increase or decrease the magnitude of the PA load based on the AGC signal, the level set adjustment signal, and the phase adjustment signal. Since the best case efficiency occurs for loads near 1:1 VSWR, a load of 1:1 VSWR is targeted in the first preferred embodiment. A change of about 0 dB in the level set adjustment signal, about 0 dB in the AGC signal, and about 0 degrees in the phase adjustment signal indicates that a VSWR of 1:1 has been attained. To drive the change in the three signals to near zero, the load controller either increases or decreases the magnitude of the PA load, whichever has the effect of reducing the change in these three signals. Thus, the load controller adjusts (212) the magnitude of the PA load to a magnitude that improves the efficiency of the PA. When the load controller determines (214) that a VSWR of 1:1 has not yet been attained, the logic flow returns to step 204 and the load controller repeats steps 204–214 until a VSWR of 1:1 is attained.

The load controller then determines (216) a phase of the PA load that improves the efficiency of the PA. To make this determination, the load controller preferably selects a phase of the PA load between the phase of the load that corresponds to the maximum of the level set adjustment signal and the phase of the load that corresponds to the minimum of the AGC signal based on a relative weighting of the phase values. In the preferred embodiment, the two phase values are given an equal weight in the determination. Thus, the average of the phase of the load that corresponds to the maximum of the level set adjustment signal and the phase of the load that corresponds to the minimum of the AGC signal is selected. The load controller then adjusts (218) the phase of the PA load to the phase selected, and the logic flow ends (220).

In an alternate embodiment in which the load corrector only produces an impedance phase signal and the PA load adjust circuit only adjusts the phase of the PA load, steps 210–214, which involve adjusting the magnitude of the PA load, are not performed. Thus, the efficiency of the PA is improved with adjustments to the PA load phase only. Such an alternative PA load controller while simpler, and therefore less expensive to develop and manufacture, may provide less improvement to the PA efficiency than a preferred load controller could.

Because environmental factors such as voltage, temperature, and frequency cause the properties of transmitter components to vary, the optimal VSWR value for PA efficiency may vary from the targeted 1:1 VSWR. In the second preferred embodiment, PA efficiency, the product of PA voltage and PA current, is monitored in order to fine tune the targeted PA load magnitude. Thus, the second preferred embodiment provides the means to adjust the PA load magnitude to a value that increases the PA efficiency over the PA efficiency at a load of 1:1 VSWR.

The logic flow of logic flow diagram 300 begins (302) when the preferred load controller steps (304) the phase of the PA load through 360 degrees. While varying the phase of the load of the PA, the load controller monitors the efficiency of the PA, the AGC signal, the level set adjustment signal, and the phase adjustment signal. For each phase of the PA load at the present PA load magnitude, the preferable load controller stores (306) the PA efficiency and the value of the AGC signal, the level set adjustment signal, and the phase adjustment signal. Upon cycling the phase of the PA load through 360 degrees, the load controller adjusts (308) the magnitude of the PA load to reduce the change in the value of the AGC signal, the level set adjustment signal, and the phase adjustment signal as the phase is cycled through 360 degrees. As in the first preferred embodiment, the magnitude of the PA load is incremented or decremented to drive the change in the three signals to near zero. In other words, the magnitude of the PA load is driven towards a VSWR of 1:1. When the load controller determines (310) that a VSWR of 1:1 has not yet been attained, the logic flow returns to step 304 and the load controller repeats steps 304–310 until a VSWR of 1:1 is attained.

When the load controller determines (310) that a VSWR of 1:1 has been attained, the load controller then determines (312) a phase and magnitude of the PA load that improves the efficiency of the power amplifier. Preferably, this involves searching the stored values for the greatest PA efficiency and the corresponding phase and magnitude of the PA load that produced this efficiency. In the preferred embodiment, however, the greatest PA efficiency is only selected from those values that correspond to PA load magnitudes between 1:1 and 1:6 VSWR. As the PA load magnitude increases, more power is reflected back from the antenna and is thus lost. A load magnitude with a VSWR of more than 1.6:1 loses an unacceptable amount of power in this manner. A change of about 0.1 dB in the level set adjustment signal, about 1.6 dB in the AGC signal, and about 34 degrees in the phase adjustment signal during a 360 degree cycle is preferably used to indicate a VSWR of 1.6:1. Thus, a phase and magnitude of the PA load corresponding to the greatest PA efficiency is selected from the stored values of the AGC signal, the level set adjustment signal, and the phase adjustment signal whose change in value is less than the thresholds above. The load controller then adjusts (314) the phase and magnitude of the PA load to the phase and magnitude of the PA load determined, and the logic flow ends (316). Effectively then, the second preferred embodiment of the present invention adjusts the PA load to the PA load corresponding to the greatest stored PA efficiency with a VSWR between 1:1 and 1.6:1.

Although the preferred embodiments make use of the AGC signal, the level set adjustment signal, and the phase adjustment signal, the change in any one or combination of these signals may be used as an indication of the magnitude of the PA load with respect to a VSWR of 1:1. Any one or combination of these signals may be used to determine whether to increase or decrease the magnitude of the PA load or whether a magnitude of the PA load is acceptable for improving PA efficiency.

The present invention meets the need for an apparatus and method for controlling the load of a PA to improve PA efficiency in linear transmitters with IE circuitry. By using the outputs of IE circuitry, the present invention avoids the need to detect the currents and voltages between the PA and the antenna using RF circuitry. Because such RF circuitry increases the size, weight, and cost of the devices, the present invention provides improvements over the prior art in all of these areas.

The continuous gain and phase adjusters of the IE circuitry compensate for the gain and phase changes of all the components in the feedback loop. Additionally, such gain and phase changes and changes in the PA load can be caused by changes in temperature, battery voltage, frequency, electric shock, environmental shock (physical impact), and component aging. Thus, it is not obvious to use the gain and phase adjusters of the IE circuitry to control the PA load and thereby improve the efficiency of the PA. The prior art requires the monitoring of frequency, temperature, and voltage to compensate for their effects on PA efficiency. In contrast, the present invention improves the PA efficiency compensating for temperature, frequency and voltage, but without the monitoring of these parameters.

The present invention improves the efficiency of PAs, thereby extending the battery-life of devices such as cellular phones and radiophones. And a longer battery-life addresses the consumer desire for ever-increasing talk-time between battery recharges. Additionally, the preferred embodiment of the present invention provides the means for adjusting the PA load for improved efficiency while meeting the off-channel noise requirements of the FCC. Thus, the present invention provides improvements to the prior art that directly address recognized consumer desires for small, low cost communication devices requiring minimal recharging.

The descriptions of the invention, the specific details, and the drawings mentioned above, are not meant to limit the scope of the present invention. It is the intent of the inventors that various modifications can be made to the present invention without varying from the spirit and scope of the invention, and it is intended that all such modifications come within the scope of the following claims and their equivalents.

What is claimed is:

1. A power amplifier load controller comprising:

an adaptive power amplifier load corrector for producing an impedance phase signal using an AGC signal, a level set adjustment signal, and a signal strength indicator, wherein the adaptive power amplifier load corrector further uses an indication of the efficiency of the power amplifier for producing an impedance phase signal and wherein the indication of the efficiency of the power amplifier is produced using a power amplifier voltage signal and a power amplifier current signal; and a power amplifier load adjust circuit for adjusting the load of a power amplifier using the impedance phase signal.

2. The power amplifier load controller of claim 1 wherein the adaptive power amplifier load corrector comprises digital and low frequency analog components but excludes RF circuit components.

3. The power amplifier load controller of claim 1 wherein the power amplifier load adjust circuit is coupled between the power amplifier and an antenna.

4. The power amplifier load controller of claim 1 wherein the power amplifier load adjust circuit is part of a matching circuit of an antenna.

5. The power amplifier load controller of claim 1 wherein the power amplifier load adjust circuit is part of a matching circuit of the power amplifier.

6. A radio frequency (RF) amplifier comprising:

a main amplifier loop capable of stabilizing an amplifier without using an isolator, the main amplifier loop comprising:

an attenuator for attenuating an input signal;

a loop filter coupled to the attenuator for providing a filtered error signal from which a drive signal is derived;

a power amplifier for receiving and amplifying the drive signal; and a power amplifier load adjust circuit for adjusting the load of the power amplifier using an impedance phase signal;

an auxiliary loop coupled to the main amplifier loop capable of changing the load of the power amplifier using a sample of the filtered error signal and a sample of the input signal, the auxiliary loop comprising:

an Automatic Gain Control (AGC) for producing an AGC signal;

a magnitude detector for detecting the magnitude of the input signal and producing a signal strength indicator;

a first circuit for producing a level set adjustment signal; and an adaptive power amplifier load corrector for producing the impedance phase signal using the AGC signal, the level set adjustment signal, and the signal strength indicator.

7. The RF amplifier of claim 6 wherein the power amplifier load adjust circuit is capable of adjusting the load of the power amplifier using an impedance phase signal and an impedance magnitude signal, wherein the auxiliary loop further comprises a second circuit for producing a phase adjustment signal, and wherein the adaptive power amplifier load corrector is capable of producing the impedance phase signal and the impedance magnitude signal using the AGC signal, the phase adjustment signal, the level set adjustment signal, and the signal strength indicator.

8. The RF amplifier of claim 6 wherein the main amplifier loop comprises a Cartesian Feedback loop capable of linearizing the power amplifier.

9. The RF amplifier of claim 8 further comprising a training circuit capable of adjusting the gain and phase of the Cartesian Feedback loop.

10. A method for a power amplifier load controller to adjust a load of a power amplifier, the method comprising the steps of:

determining a phase of the load of the power amplifier that minimizes an AGC signal, wherein the AGC signal controls the linear gain of a Cartesian feedback loop that contains the power amplifier;

determining a phase of the load of the power amplifier that maximizes a level set adjustment signal;

determining a phase of the load of the power amplifier that improves the efficiency of the power amplifier; and adjusting the phase of the load of the power amplifier to the phase of the load of the power amplifier that improves the efficiency of the power amplifier as determined.

11. The method of claim 10 wherein the step of determining the phase of the load of the power amplifier that minimizes the AGC signal comprises the steps of:

stepping the phase of the load of the power amplifier through 360 degrees; and monitoring the AGC signal to determine a phase of the load that corresponds to a minimum of the AGC signal.

12. The method of claim 10 wherein the step of determining the phase of the load of the power amplifier that maximizes the level set adjustment signal comprises the steps of:

stepping the phase of the load of the power amplifier through 360 degrees; and monitoring the level set adjustment signal to determine a phase of the load that corresponds to a maximum of the level set adjustment signal.

13. The method of claim 10 wherein the step of determining a phase of the load of the power amplifier that improves the efficiency of the power amplifier comprises the step of selecting a phase of the load of the power amplifier between the phase of the load that corresponds to a maximum of the level set adjustment signal and the phase of the load that corresponds to a minimum of the AGC signal based on a relative weighting of the phase values.

14. The method of claim 10 further comprising the steps of:

determining a magnitude of the load of the power amplifier that improves the efficiency of the power amplifier; and adjusting a magnitude of the load of the power amplifier to the magnitude of the load of the power amplifier that improves the efficiency of the power amplifier as determined.

15. The method of claim 14 wherein the step of determining a magnitude of the load of the power amplifier that improves the efficiency of the power amplifier comprises the steps of:

stepping the phase of the load of the power amplifier through 360 degrees; and determining whether to increase or decrease the magnitude of the load of the power amplifier based on the AGC signal, the level set adjustment signal, and a phase adjustment signal.

16. A method for a power amplifier load controller to adjust a load of a power amplifier contained within a Cartesian feedback loop, the method comprising the steps of:

monitoring the efficiency of the power amplifier and at least one signal selected front the group consisting of an AGC signal, a level set adjustment signal, and a phase adjustment signal, while varying the phase of the load of the power amplifier, wherein the AGC signal controls the linear gain of the Cartesian feedback loop;

determining a phase and magnitude of the load of the power amplifier that improves the efficiency of the power amplifier; and adjusting the phase and magnitude of the load of the power amplifier to the phase and magnitude of the load of the power amplifier that improves the efficiency of the power amplifier as determined.

17. The method of claim 16 wherein the step of monitoring comprises the step of stepping the phase of the load of the power amplifier through 360 degrees.

18. The method of claim 17 further comprising the step of adjusting the magnitude of the load of the power amplifier to reduce the change in value of at least one signal selected from the group consisting of the AGC signal, the level set adjustment signal, and the phase adjustment signal.

19. The method of claim 18 wherein the step of monitoring further comprises the step of storing an efficiency of the power amplifier and the value of at least one signal selected from the group consisting of the AGC signal, the level set adjustment signal, and the phase adjustment signal that corresponds to a phase and a magnitude of the load of the power amplifier.

20. The method of claim 19 wherein the step of determining a phase and magnitude of the load of the power amplifier that improves the efficiency of the power amplifier comprises the step of determining the phase and magnitude of the load of the power amplifier that corresponds to the greatest efficiency of the power amplifier that was stored.

21. The method of claim 20 wherein the step of determining the phase and magnitude of the load of the power amplifier that corresponds to the greatest efficiency of the power amplifier that was stored comprises the step of selecting the phase and magnitude of the load of the power amplifier from phases and magnitudes of the load of the power amplifier that correspond only to a value of at least one signal selected from the group consisting of the AGC signal, the level set adjustment signal, and the phase adjustment signal whose change in value is less than at least one threshold.

22. A power amplifier load controller comprising:

an adaptive power amplifier load corrector for producing an impedance phase signal using an AGC signal, a level set adjustment signal, and a signal strength indicator; and a power amplifier load adjust circuit for adjusting the load of a power amplifier using the impedance phase signal, wherein the adaptive power amplifier load corrector is further capable of producing an impedance magnitude signal using the AGC signal, a phase adjustment signal, the level set adjustment signal, and the signal strength indicator wherein the power amplifier load adjust circuit is further capable of adjusting the load of the power amplifier using the impedance phase signal and the impedance magnitude signal and wherein the AGC signal, the phase adjustment signal, the level set adjustment signal, and the signal strength indicator are produced by an isolator elimination circuit coupled to the power amplifier.

23. The power amplifier load controller of claim 22 wherein the adaptive power amplifier load corrector changes the impedance phase signal and the impedance magnitude signal only when the signal strength indicator indicates that an input signal is small relative to modulation peaks of the input signal.

24. The power amplifier load controller of claim 22 wherein the isolator elimination circuit produces the phase adjustment signal and the level set adjustment signal only when an input signal is small relative to modulation peaks of the input signal.

25. The power amplifier load controller of claim 22 wherein the rate at which the adaptive power amplifier load corrector changes the impedance phase signal and the impedance magnitude signal is less than the rate at which the isolator elimination circuit changes the phase adjustment signal and the level set adjustment signal.

* * * * *